(12) United States Patent
Li et al.

(10) Patent No.: US 8,916,435 B2
(45) Date of Patent: Dec. 23, 2014

(54) SELF-ALIGNED BOTTOM PLATE FOR METAL HIGH-K DIELECTRIC METAL INSULATOR METAL (MIM) EMBEDDED DYNAMIC RANDOM ACCESS MEMORY

(75) Inventors: Zhengwen Li, Wappingers Falls, NY (US); Damon B. Farmer, White Plains, NY (US); Michael P. Chudzik, Danbury, CT (US); Keith Kwong Hon Wong, Wappingers Falls, NY (US); Jian Yu, Danbury, CT (US); Zhen Zhang, Ossining, NY (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 13/228,767

(22) Filed: Sep. 9, 2011

(65) Prior Publication Data
US 2013/0062677 A1    Mar. 14, 2013

(51) Int. Cl.
*H01L 21/8242*  (2006.01)
*H01L 27/12*  (2006.01)
*H01L 27/108*  (2006.01)
*H01L 49/02*  (2006.01)
*H01L 21/84*  (2006.01)
*H01L 29/94*  (2006.01)

(52) U.S. Cl.
CPC ...... *H01L 27/10829* (2013.01); *H01L 27/1203* (2013.01); *H01L 29/945* (2013.01); *H01L 27/10861* (2013.01); *H01L 28/91* (2013.01); *H01L 21/84* (2013.01)
USPC .................... 438/243; 438/386; 257/E21.651

(58) Field of Classification Search
USPC .................. 438/239, 243, 244, 386–388; 257/E21.646–E21.653
See application file for complete search history.

(56) References Cited

U.S. PATENT DOCUMENTS

| | | |
|---|---|---|
| 5,075,251 A | 12/1991 | Torres et al. |
| 5,130,267 A | 7/1992 | Kaya et al. |
| 5,192,703 A | 3/1993 | Lee et al. |
| 6,218,239 B1 | 4/2001 | Huang et al. |

(Continued)

OTHER PUBLICATIONS

Becker, J. et al. "Highly Conformal Thin Films of Tungsten Nitride Prepared by Atomic Layer Deposition from a Novel Precursor" American Chemical Society pp. 2969-2976 Jun. 20, 2003.

(Continued)

*Primary Examiner* — Laura Menz
*Assistant Examiner* — Candice Y Chan
(74) *Attorney, Agent, or Firm* — Scully, Scott, Murphy & Presser, P.C.; Joseph P. Abate, Esq.

(57) ABSTRACT

A memory device, and a method of forming a memory device, is provided that includes a capacitor with a lower electrode of a metal semiconductor alloy. In one embodiment, the memory device includes a trench present in a semiconductor substrate including a semiconductor on insulating (SOI) layer on top of a buried dielectric layer, wherein the buried dielectric layer is on top of a base semiconductor layer. A capacitor is present in the trench, wherein the capacitor includes a lower electrode of a metal semiconductor alloy having an upper edge that is self-aligned to the upper surface of the base semiconductor layer, a high-k dielectric node layer, and an upper electrode of a metal. The memory device further includes a pass transistor in electrical communication with the capacitor.

17 Claims, 5 Drawing Sheets

(56) References Cited

U.S. PATENT DOCUMENTS

| | | |
|---|---|---|
| 6,451,667 B1 | 9/2002 | Ning |
| 6,608,341 B2 | 8/2003 | Schrems |
| 6,664,161 B2 | 12/2003 | Chudzik et al. |
| 6,693,016 B2 | 2/2004 | Gutsche et al. |
| 7,329,939 B2 | 2/2008 | Hsu et al. |
| 2005/0179077 A1* | 8/2005 | Schnitt .......................... 257/306 |
| 2011/0042731 A1* | 2/2011 | Ho et al. ....................... 257/296 |

OTHER PUBLICATIONS

IBM TDB—"High Capacitance Tungsten to Metal 1 Capacitor for High Frequency Applications" IP.com No. IPCOM000114995D Publication Date: Feb. 1, 1995 IP.com Electronic Publication: Mar. 30, 2005.

* cited by examiner

SELF-ALIGNED BOTTOM PLATE FOR METAL HIGH-K DIELECTRIC METAL INSULATOR METAL (MIM) EMBEDDED DYNAMIC RANDOM ACCESS MEMORY

BACKGROUND

The present disclosure generally relates to trench structures, such as embedded DRAM devices.

Embedded DRAM devices may include trench capacitors. A trench capacitor is a three dimensional device that can be formed by etching a trench into a semiconductor substrate. After trench etching, a buried plate electrode, also referred to as a diffusion plate, is typically formed about the exterior portion of the trench and a node dielectric is then formed on the inner walls of the trench. Next, the trench can be filled, for example, with doped polysilicon, such as N-type polycrystalline silicon ("N-type Poly-Si"). The doped poly-Si serves as one electrode of the capacitor, often referred to as the upper electrode or storage node, and the buried plate electrode serves as a second electrode of the capacitor, often referred to as the lower electrode. A node dielectric separates the buried plate and the upper electrode, and serves as the insulating layer of the trench capacitor.

SUMMARY

A method for forming a trench structure is provided for a semiconductor and/or memory device, such as an embedded DRAM device. In one embodiment, the method of forming the trench structure comprises providing a semiconductor substrate including a semiconductor on insulating (SOI) layer on top of a buried dielectric layer, wherein the buried dielectric layer is on top of a base semiconductor layer. A trench is formed to a first depth in the semiconductor substrate, wherein the first depth of the trench extends through the SOI layer and the buried dielectric layer terminating on the base semiconductor layer. A dielectric spacer is formed on the sidewalls of the trench, wherein the dielectric spacer extends to an upper surface of the base semiconductor layer. The trench may then be extended to a second depth into the base semiconductor layer of the semiconductor substrate. A metal-containing layer is formed on the sidewalls and base of the trench. The metal-containing layer may be in direct contact with the base semiconductor layer of the semiconductor substrate. The metal-containing layer that is in direct contact with the base semiconductor layer is converted into a metal semiconductor alloy lower electrode, in which an upper edge of the metal semiconductor alloy lower electrode is aligned to the upper surface of the base semiconductor layer. A dielectric layer is formed on the metal semiconductor alloy lower electrode, and an upper electrode is formed on the dielectric layer.

In another aspect, a memory device is provided that includes a capacitor with a lower electrode composed of a metal semiconductor alloy. In one embodiment, the memory device includes a trench present in a semiconductor substrate including a semiconductor on insulating (SOI) layer on top of a buried dielectric layer, wherein the buried dielectric layer is on top of a base semiconductor layer. A capacitor is present in the trench, wherein the capacitor includes a lower electrode comprised of a metal semiconductor alloy having an upper edge that is aligned to the upper surface of the base semiconductor layer, a high-k dielectric node layer, and an upper electrode comprised of a metal. The memory device further includes a pass transistor in electrical communication with the capacitor.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
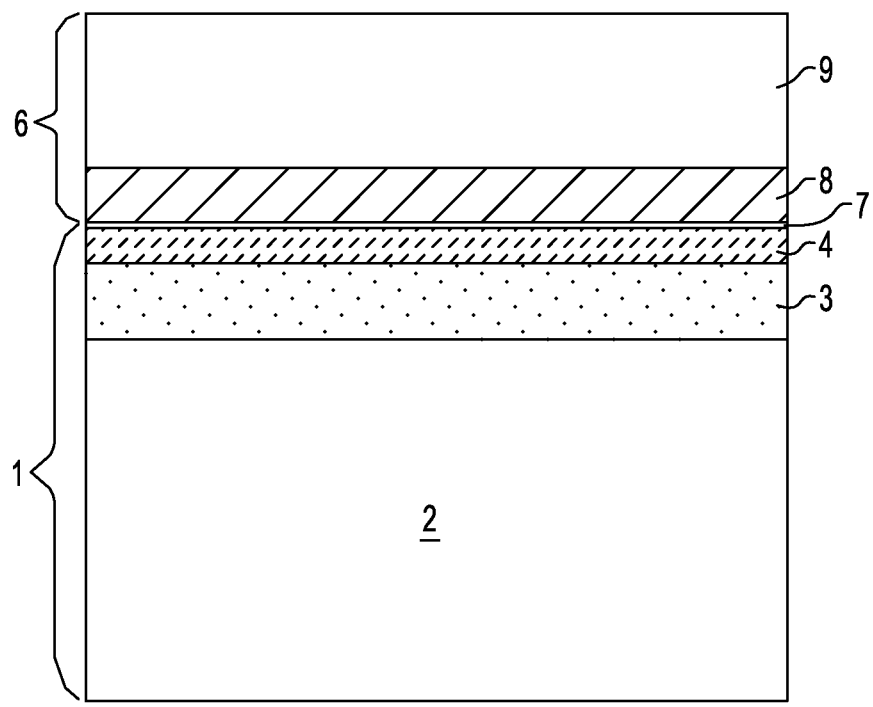
FIG. 1 is a side cross-sectional view depicting a semiconductor on insulator (SOI) substrate having a pad dielectric stack disposed thereon, in accordance with one embodiment of the present disclosure.

Detailed embodiments of the present disclosure are disclosed herein; however, it is to be understood that the disclosed embodiments are merely illustrative and may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to methods for producing an electrode of a capacitor structure in a high aspect ratio (height to width ratio) trench. A trench with a high aspect ratio is a trench having an aspect ratio that is greater than 5:1. The term "electrode" as used to describe a component of the capacitor represents one of at least two electrically conductive materials of the capacitor that are separated by a dielectric layer, e.g., node dielectric layer.

In embedded dynamic random access memory (eDRAM) devices, a capacitor is typically present in a trench. The capacitor of the eDRAM device typically includes a buried plate electrode, i.e., bottom electrode, node dielectric and a top electrode. It has been determined that the buried plate electrodes that are formed by filling the trench with arsenosilicate glass (ASG) and the diffusing arsenic from the fill material into the sidewalls of the trench, or by forming the buried plate electrodes using ion implantation, produces eDRAM devices having decreased performance, e.g., read/write on-off response time. Further, with increased scaling of the eDRAM cell, e.g., scaling to the 22 nm node, and increased scaling down of the deep trenches, e.g., scaling of deep trenches to a critical dimension on the order of <100 nm, it is increasingly difficult to introduce the dopant for the lower electrode into the trench using ASG deposition or ion implantation. In one embodiment, the methods and structures disclosed herein overcome the difficulties of ASG deposition or ion implantation by forming the lower electrode by depositing a metal-containing layer into the trench and converting the metal-containing layer into a metal semiconductor alloy.

It has also been determined that a node dielectric composed of a high-k dielectric material may be formed in direct contact with a lower electrode formed from a metal-containing layer that is deposited into a trench and then converted into a metal semiconductor alloy. In trench structures including a lower electrode formed from ASG deposition and outdiffusion process, or an ion implantation process, a low-k dielectric interfacial layer is formed on the lower electrode prior to forming a high-k node dielectric in order to reduce leakage. In some embodiments, by depositing a high-k dielectric material into direct contact with a lower electrode formed from a metal-containing layer and removing the low-k dielectric interfacial layer, the methods and structures of the present disclosure may reduce the equivalent oxide thickness (EOT), while increasing capacitance.

FIGS. 1-8 depict one embodiment of a method of forming a trench structure that includes forming a metal-containing layer 14 on the sidewalls and base of a trench 13 formed in an SOI substrate 1, and then converting the metal-containing layer 14 that is in direct contact with the semiconductor material of the SOI substrate 1 into a metal semiconductor alloy lower electrode 18 having an upper edge U1 that is aligned to the upper surface S1 of the base semiconductor layer 2. In one embodiment, the methods disclosed herein may use atomic layer deposition (ALD) to deposit a metal-containing layer 14 of tungsten nitride (WN) within a trench 13 to form the lower electrode. Typically, the tungsten nitride will decompose at temperatures greater than 800° C. to provide a tungsten (W) metal layer on the sidewalls and base of the trench, wherein the tungsten will be converted to a tungsten silicide ($WSi_x$) lower electrode when heated at a temperature of higher than 900° C.

Referring to FIG. 1, and in some embodiments, the method may begin with forming a pad dielectric stack 6 on the SOI substrate 1. In the example depicted in FIG. 1, the SOI substrate 1 includes a semiconductor on insulator (SOI) layer 4, such as a silicon-containing semiconductor layer, located on a surface of a buried dielectric layer 3, such as a buried oxide layer. Underlying the buried dielectric layer 3 is a lower semiconductor layer, i.e., base semiconductor layer 2. In one embodiment, the SOI layer 4 and the base semiconductor layer 2 are both comprised of silicon (Si). In other embodiments, the SOI layer 4 and/or the base semiconductor layer 2 may include any semiconductor material including, but not limited to; Ge, SiGe, GaAs, InAs, InP, or other III/IV compounds. The SOI layer 4 typically has a thickness greater than 5 nm, e.g., 5 nm to 200 nm. The thickness of the base semiconductor layer 2 may range up to 800 micrometers. In one embodiment, the buried dielectric layer 3 is composed of silicon oxide ($SiO_2$). In other embodiments, the buried dielectric layer 3 may be any dielectric material, such as an oxide, nitride or oxynitride. The thickness of the buried dielectric layer 3 may range from may have a thickness ranging from 10 nm to 500 nm. The SOI substrate 1 may be formed using a bonding process, or it may be formed using an ion implantation process. The SOI substrate 1 may also be formed by depositing the material layers for the SOI layer 4 and the buried dielectric layer 3 on the base semiconductor layer 2, in which the base semiconductor layer 2 may be provided by a bulk substrate.

The pad dielectric stack 6 includes at least one dielectric layer. The pad dielectric stack 6 may be formed on the surface of the SOI substrate 1 using deposition and/or thermal growth processes. The pad dielectric stack 6 may comprise a single pad dielectric layer, or the pad dielectric stack 6 may comprise a multi-layered structure. In the example depicted in FIG. 1, the pad dielectric stack 6 includes a first pad dielectric layer 7, e.g., a pad oxide layer, a second pad dielectric layer 8, e.g., a pad nitride layer, and a third pad dielectric layer 9, e.g., a high density plasma (HDP) chemical vapor deposition (CVD) deposited oxide. The first pad dielectric layer 7 may be silicon oxide having a thickness ranging from 1 nm to 10 nm. The second pad dielectric layer 8 may be silicon nitride having a thickness ranging from 10 nm to 200 nm. The third pad dielectric layer 9 may be HDPCVD silicon oxide having a thickness ranging from 10 nm to 1500 nm.

Figure 2:
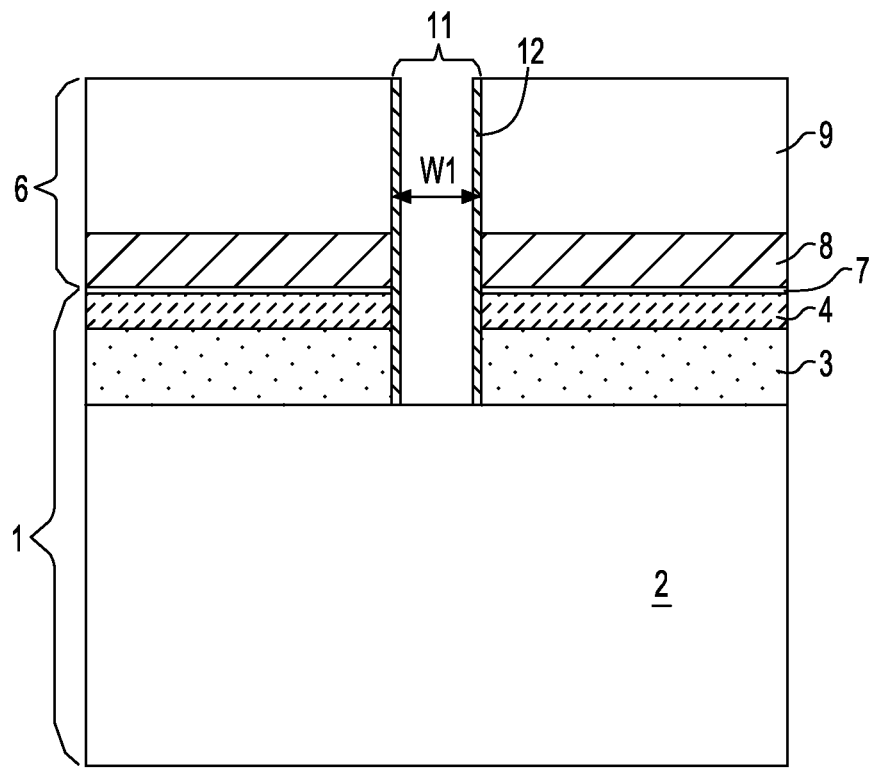
FIG. 2 is a side cross-sectional view depicting forming an opening in the pad dielectric stack, the SOI layer of the SOI substrate, and the buried dielectric layer of the SOI substrate, in accordance with one embodiment of the present disclosure.

Referring to FIG. 2, an opening 11 is etched through the pad dielectric stack 6 into the SOI substrate 1, stopping on the base semiconductor layer 2. The pad dielectric stack 6 can be patterned using lithography and etching. In one example, a photolithographic mask (not shown) is produced, by applying a photoresist layer (not shown) on the exposed surface layer of the surface to be etched utilizing a deposition process. The photoresist layer is then patterned utilizing lithography so as to expose selective regions of the pad stack 6 in which trenches are to be formed. The pattern is then transferred into the layer of the pad dielectric stack 6 using an etching process, such as reactive-ion etching (RIE), ion beam etching, or plasma etching.

Thereafter, the exposed portion of the SOI substrate 1 is etched to provide the opening having a first depth terminating on the base semiconductor layer 2. The opening 11 may be formed using an anisotropic etch process. As used herein, an "anisotropic etch process" denotes a material removal process in which the etch rate in the direction normal to the surface to be etched is higher than in the direction parallel to the surface to be etched. Dry anisotropic etching processes suitable for forming the at least one opening 11 include, but are not limited to, reactive ion etch, ion-beam etching, plasma etching or a combination thereof Reactive ion etching (RIE) is a form of plasma etching in which during etching the surface to be etched is exposed to reactive gases in the presence of an RF field. The width $W_1$ of the opening 11 may range from 30 nm to 250 nm. More typically, the width $W_1$ of the opening 11 may range from 50 nm to 200 nm.

Still referring to FIG. 2, a dielectric spacer 12 may be formed on the sidewalls of the trench opening 11. In one example, the dielectric spacer 12 is composed of silicon nitride (SiN). In other examples, the dielectric spacer 12 may be composed of other dielectric materials, such as, nitrides, oxides, oxynitrides or multilayers and combinations thereof The spacer 12 may be formed using a deposition process, such as chemical vapor deposition (CVD). The portion of the material layer that provides the spacer 12 that is formed on the base of the trench opening 11 may be removed by an etch process so that the remaining portion of the material layer that provides the dielectric spacer 12 is only present on the trench sidewalls. In one embodiment, the etch process that removes the base portion of the material layer that provides the spacer 12 is a reactive ion etch process. The width of each spacer 12 may range from 1 nm to 15 nm.

Figure 3:
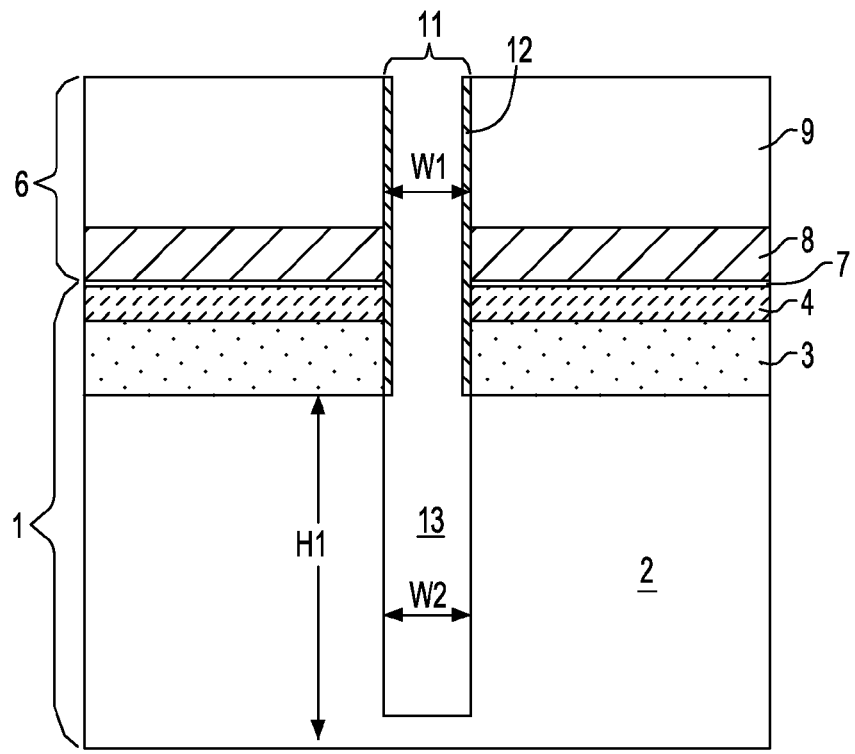
FIG. 3 is a side cross-sectional view depicting forming a dielectric spacer on the sidewalls of the trench, and extending the trench into the base semiconductor layer of the SOI substrate, in accordance with one embodiment of the present disclosure.

Referring to FIG. 3, the opening 11 can be extended into the base semiconductor layer 2 of the SOI substrate 1 to provide a trench 13 having a second depth. In one embodiment, the trench 13 is an extension of the opening 11 into the base semiconductor layer 2 of the SOI substrate 1. Etching of the trench 13 into the base semiconductor layer 2 of the semiconductor substrate 1 may be performed using a timed etch process step that is selective to removing the material of the base semiconductor layer 2 of semiconductor substrate 1 as opposed to the material of the pad dielectric stack 6. Dry etching processes that may be used to form the trench 13 include, but are not limited to, RIE, ion-beam etching, plasma etching or any other like dry etch process and combinations thereof. In one embodiment, the final depth $H_1$ of the trench 13, as measured from the top surface of the base semiconductor layer 2 is as great as 10 μm. In one example, the final depth $H_1$ is on the order of about 3 μm to 4 microns. The aspect ratio (height to width ratio) of the trench 13 may range from 5:1 to 100:1. In one example, the aspect ratio of the trench 13 is 30:1.

Figure 4:
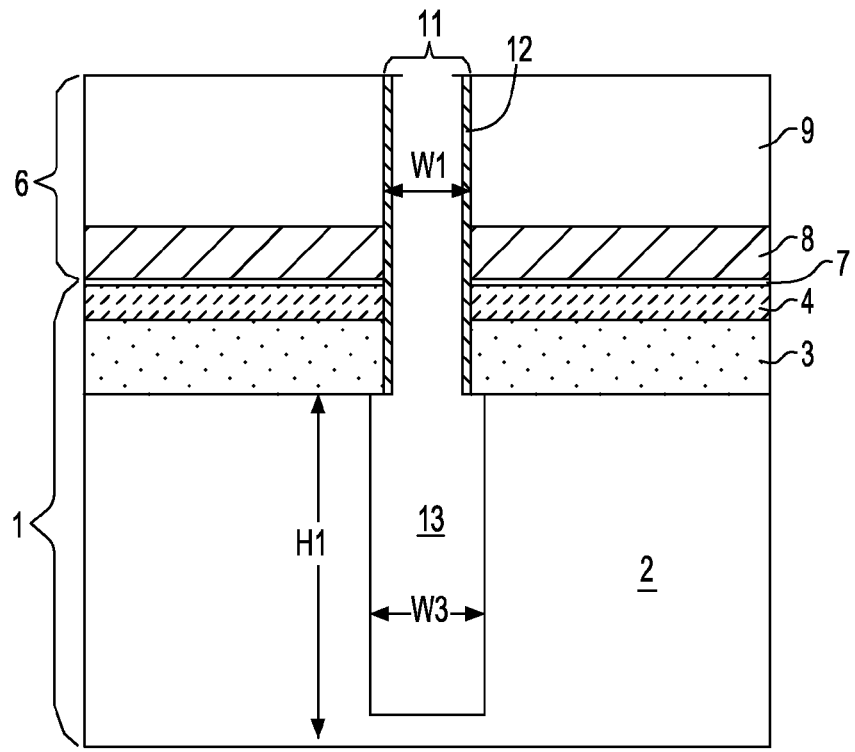
FIG. 4 is a side cross-sectional views depicting widening the trench, in accordance with one embodiment of the present disclosure.

FIG. 4 depicts etching the trench 13 to increase the width of the trench 13 in the base semiconductor layer 2, which provides a trench 13 with larger area to increase capacitance. In the present case, the etch removes the material of the base semiconductor layer 2 selective to the pad dielectric stack 6 and the buried dielectric layer 3. In one embodiment, the sidewall of the SOI layer 4 is protected during the etch by the dielectric spacer 12. In one embodiment, the base semiconductor layer 2 is etched with a composition including hydrofluoric acid (HF) and ammonium hydroxide (NH$_4$OH) to obtain the bottle-shaped trench. In one example, the enlarged width $W_3$ of the trench 13 may range from 50 nm to 200 nm. In some embodiments, the widening of the trench 13 is optional, and may be omitted from the process flow of the present disclosure.

In one embodiment, the sidewalls and base of the trench 13 in the base semiconductor layer 2 may be doped with an n-type or p-type dopant. In one embodiment, the n-type or p-type dopant that is implanted into the base semiconductor layer 2 may be present in a concentration ranging from $1 \times 10^{14}$ atoms/cm$^3$ to $1 \times 10^{19}$ atoms/cm$^3$. In one example, the dopant source to produce a N+ buried plate diffusion region may be introduced by ion-implantation. The p-type or n-type dopant that is implanted into the trench portion of the base semiconductor layer 2 may be omitted. In the embodiments, in which the p-type or n-type ion implantation step is omitted, the base semiconductor layer has a maximum concentration of n-type dopant, p-type dopant or a combination of n-type and p-type dopant in the sidewalls of the trench 13 that is no greater than $1 \times 10^{19}$ atoms/cm$^3$.

Figure 5:
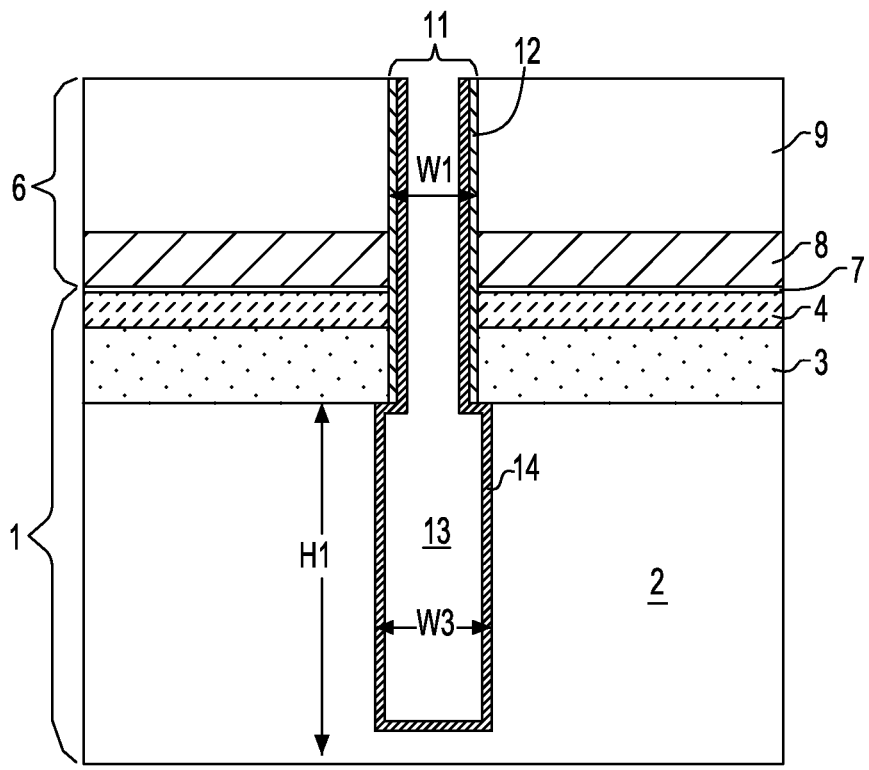
FIG. 5 is a side cross-sectional view depicting forming a metal-containing layer on the sidewalls of the trench, in accordance with one embodiment of the present disclosure.

Referring to FIG. 5, a metal-containing layer 14 is formed on the sidewalls of the trench 13. The term "metal-containing" denotes that at least one elemental metal is present in the material layer being deposited. In some embodiments, the metal-containing layer 14 is conformally deposited on both the sidewalls and the base of the trench 13. As used herein, "conformal layer" is a deposited material having a thickness that remains the same regardless of the geometry of underlying features on which the layer is deposited, wherein the thickness of the layer does not deviate from greater than or less than 20% of an average value for the thickness of the layer. In one embodiment, the conformally deposited metal-containing layer 14 has a thickness ranging from 1 nm to 20 nm. In another embodiment, the conformally depicted metal-containing layer 14 has a thickness ranging from 3 nm to 7 nm. The metal-containing layer 14 is in direct contact with base semiconductor layer 2 that provides the sidewalls and base in the lower portion of the trench 13, and the metal-containing layer 14 is in direct contact with the dielectric spacers 12 in the upper portion of the trench 13.

The conformal deposition process that deposits the metal-containing layer 14 may be Atomic Layer Deposition (ALD). Atomic Layer Deposition (ALD) uses sequential self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. Due to the characteristics of self-limiting and surface reactions, ALD film growth makes atomic scale deposition control possible. By keeping the precursors separate throughout the coating process, atomic layer control of film growth can be obtained as fine as ~0.1 Å per cycle. Separation of the precursors is accomplished by pulsing a purge gas (typically nitrogen or argon) after each precursor pulse to remove excess precursor from the process chamber.

In one embodiment, the growth of material layers by ALD consists of repeating the following four steps of: 1) exposure of the first precursor, 2) purge or evacuation of the reaction chamber to remove the non-reacted precursors and the gaseous reaction by-products, 3) exposure of the second precursor—or another treatment to activate the surface again for the reaction of the first precursor, and 4) purge or evacuation of the reaction chamber. To grow a material layer, reaction cycles are repeated as many as required for the desired film thickness. One cycle may take time from 0.5 seconds to a few seconds and may deposit between 0.1 Å and 3 Å of film thickness.

In one example, the metal-containing layer that is deposited by ALD may be tungsten nitride. The tungsten nitride metal-containing layer may be deposited having a thickness ranging from 1 nm to 20 nm. In another embodiment, the tungsten nitride metal-containing layer may be deposited having a thickness ranging from 3 nm to 7 nm. Although, the metal-containing layer 14 is hereafter described as being a tungsten nitride, it is noted that the present disclosure is not limited to only this embodiment. For example, the metal-containing layer 14 may also be composed of other metal nitrides, such as titanium nitride (TiN), tantalum nitride (TaN), tantalum silicon nitride (TaSiN), or a combination thereof, or the metal-containing layer 14 may be composed of elemental metals, such as tungsten (W), titanium (Ti), tantalum (Ta), platinum (Pt), palladium (Pd), Hafnium (Hf), Zirconium (Zr), aluminum (Al) and combinations thereof.

Following deposition, the tungsten nitride layer may be annealed to a temperature greater than 750° C. and less than 1000° C. until the tungsten nitride layer decomposes to a layer of tungsten (W). More specifically, during annealing the tungsten nitride decomposes so that nitrogen (N) may out gas from the material layer Following decomposition of the tungsten nitride to tungsten, the thickness of the tungsten metal-containing layer 14 is decreased to approximately 70% of the original thickness of the tungsten nitride metal containing layer 14. In one example, the thickness of the metal-containing layer 14 following decomposition from tungsten nitride to tungsten ranges from 2 nm to 10 nm.

Figure 6:
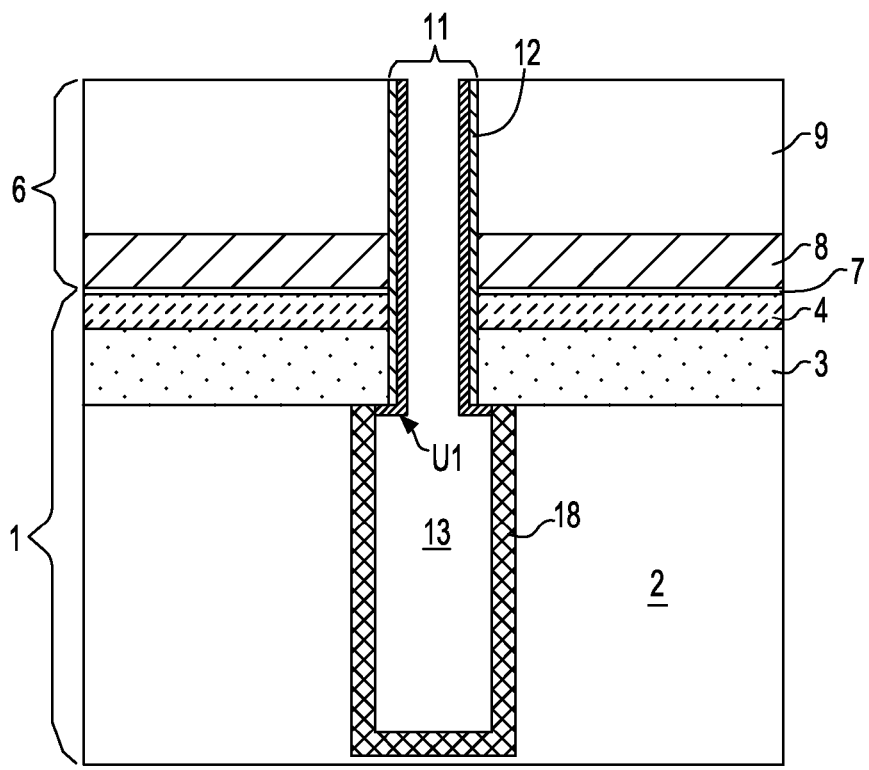
FIG. 6 is a side cross-sectional view depicting converting the metal-containing layer that is in direct contact with the base semiconductor layer into a metal semiconductor alloy lower electrode, in accordance with one embodiment of the present disclosure.

FIG. 6 depicts converting the metal-containing layer 14 that is in direct contact with the base semiconductor layer 2 into a metal semiconductor alloy lower electrode 18, in which an upper edge U1 of the metal semiconductor alloy lower electrode 18 is aligned to the upper surface S1 of the base semiconductor layer 2. As used herein, the term "metal semiconductor alloy" is an alloy of a metal and semiconductor. An alloy is mixture or solid solution, in which the atoms of the metal replace or occupy interstitial positions between the atoms of the semiconductor. A metal silicide is an alloy, in which the semiconductor component of the alloy is provided by silicon. In the embodiments in which the metal-containing layer 14 is composed of tungsten, the metal-containing layer 14 is converted to a metal semiconductor alloy lower electrode 18 that is composed of tungsten silicide ($WSi_x$). In one example, the metal semiconductor alloy lower electrode 18 is composed of tungsten disilicide ($WSi_2$). Annealing to convert the metal-containing layer 14 to the metal semiconductor alloy lower electrode 18 may include an annealing temperature that may be greater than 1000° C., but the annealing temperature may be any temperature that promotes interdiffusion of the metal from the metal-containing layer 14 and the semiconductor from the base semiconductor layer 2 in the formation of the metal semiconductor alloy lower electrode 18.

In some embodiments, in which the metal-containing layer 14 is initially deposited as a tungsten nitride layer, the annealing process that converts the metal-containing layer 14 into the metal semiconductor alloy lower electrode 18 may include a two stage annealing process, wherein a first stage of the two stage annealing process converts the tungsten nitride metal-containing layer to a tungsten metal layer, and a second stage of the two stage annealing process converts the tungsten metal layer to tungsten silicide lower electrode. In one embodiment, the first stage of the two stage annealing process includes a first temperature ranging from 750° C. or greater to less than 1000° C., and the second stage of the two stage annealing process includes a second temperature of greater than 900° C. The metal-containing layer 14 that is in direct contact with the sidewalls and base of the trench 13 in the base semiconductor layer 2 is converted to the metal semiconductor alloy lower electrode 18, while the portion of the metal containing layer 14 that is present on the dielectric spacer 12 is not converted to a metal semiconductor alloy. Because, the lower surface of the dielectric spacer 12 terminates on the upper surface of the base semiconductor layer 2, and the metal-containing layer is deposited to be in direct contact with the base semiconductor layer 2 beginning at the interface between the buried dielectric layer 3 and the base semiconductor layer 2, the method disclosed herein provides a metal semiconductor alloy lower electrode 18 having an upper edge U1 that is self-aligned to the upper surface S1 of the base semiconductor layer 2.

Figure 7:
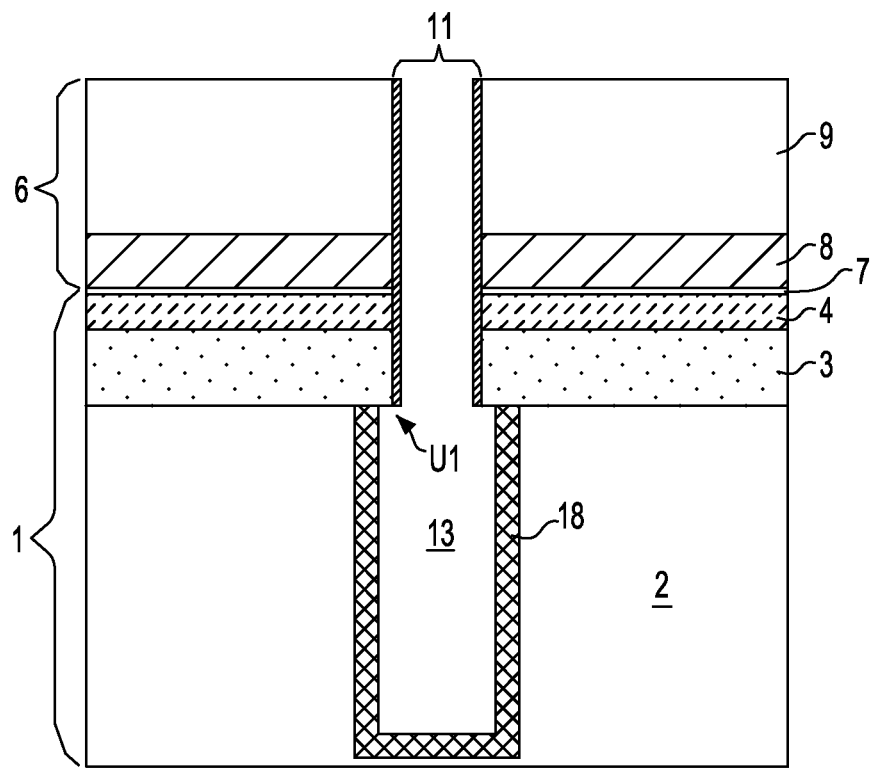
FIG. 7 is a side cross-sectional view depicting removing a portion of the metal-containing layer that has not been converted to the metal semiconductor alloy lower electrode, in accordance with one embodiment of the present disclosure.

FIG. 7 depicts one embodiment of removing the remaining portion of the metal-containing layer 14 that has not been converted to the metal semiconductor alloy lower electrode 18. In one embodiment, the remaining portion of the metal-containing layer 14 is removed with an etch that is selective to at least the metal semiconductor alloy lower electrode 18. As used herein, the term "selective" in reference to a material removal process denotes that the rate of material removal for a first material is greater than the rate of removal for at least another material of the structure to which the material removal process is being applied. In some examples, the selectivity may be greater than 10:1. In one embodiment, removing the remaining portion of metal-containing layer 14 includes a wet etch process that is selective to the metal semiconductor alloy lower electrode 18.

Figure 8:
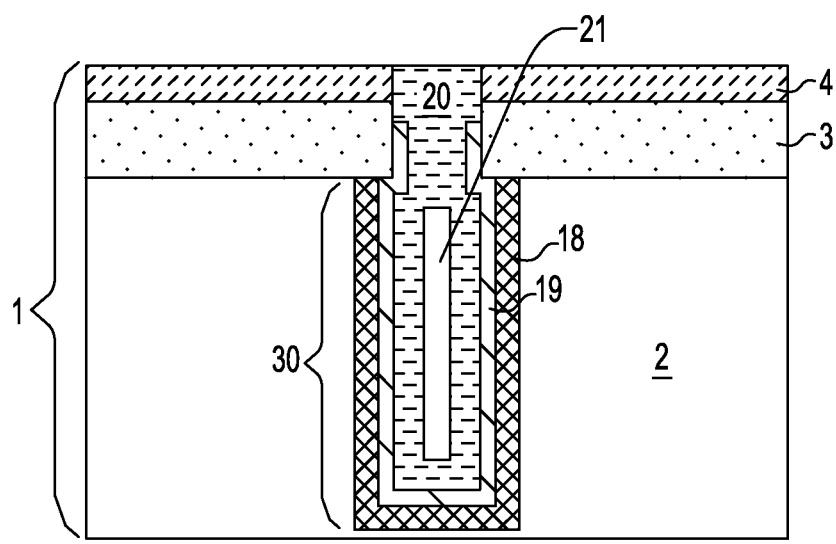
FIG. 8 is a side cross-sectional view depicting forming a dielectric layer on the metal semiconductor alloy lower electrode, and forming an upper electrode on the dielectric layer, in accordance with one embodiment of the present disclosure.

FIG. 8 depicts one embodiment of forming a dielectric layer 19 (hereafter referred to as a "node dielectric layer") on the metal semiconductor alloy lower electrode 18, and forming an upper electrode 20 on the node dielectric layer 19. In some embodiments, prior to forming the node dielectric layer 19, the dielectric spacers 12 are removed from the sidewalls of the trench 13.

In some embodiments, following removal of the dielectric spacers 12, a conformal dielectric layer is formed on the metal semiconductor alloy lower electrode 18 to provide the node dielectric layer 19 of the capacitor. The "node dielectric layer" is the dielectric layer that is present between the electrodes of the capacitor. In one embodiment, the node dielectric 19 is composed of a high-k dielectric material. The term "high-k" denotes a dielectric material having a dielectric constant at room temperature (20° C. to 25° C.) and atmospheric pressure (1 atm) that is greater than the dielectric constant of silicon oxide ($SiO_2$). For example, a high-k dielectric material typically has a dielectric constant greater than 4.0 at room temperature and atmospheric pressure. In one example, the node dielectric layer 19 is composed of hafnium-containing dielectric, such as hafnium oxide ($HfO_2$). Other dielectric compositions that are suitable for the high-k node dielectric layer 19 may include hafnium silicon oxide, hafnium silicon oxynitride, aluminum oxide, silicon nitride and combinations thereof.

In one embodiment, a hafnium-containing node dielectric layer 19, such as hafnium oxide, is deposited directly on the metal semiconductor alloy lower electrode 18 of tungsten silicide without any interfacial dielectric material, such as low-k dielectric materials, between the node dielectric layer 19 and the metal semiconductor alloy lower electrode 18. As indicated above, lower electrodes formed in the trench sidewalls by ion implantation and/or ASG deposition and outdiffusion processes require that a low-k interfacial dielectric layer be present between the lower electrode and high-k node dielectrics to avoid leakage. The additional low-k interfacial dielectric layer typically reduces the electrical performance of the capacitor. The metal semiconductor alloy lower electrode 18 provided by the present disclosure allows for a high-k node dielectric layer 19 to be formed in direct contact with the metal semiconductor alloy lower electrode 18, therefore eliminating the low-k interfacial dielectric layer and the equivalent dielectric oxide thickness (EOT) can be significantly increased. In one example, the EOT can be reduced 90% from 20-30 Å to 10-12 Å by eliminating the interfacial low-k materials.

Referring to FIG. 8, the node dielectric layer 19 is conformally deposited on the sidewalls and base of the trench 13. In one embodiment, the node dielectric 19 may be deposited using chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes suitable for providing the node dielectric layer 19 include, but are not limited to: Atmospheric Pressure CVD (APCVD), Low Pressure CVD (LPCVD), Plasma Enhanced CVD (EPCVD), Metal-Organic CVD (MOCVD), atomic layer deposition, and combinations thereof. In another example, the node dielectric layer 19 is deposited using atomic layer deposition.

Following the formation of the node dielectric layer 19, an upper electrode 20 is formed atop the node dielectric layer 19. The upper electrode 20 is composed of a conductive material, such as a metal. In one embodiment, the conductive material of the upper electrode 21 may comprise titanium nitride (TiN), tantalum nitride (TaN), tantalum silicon nitride (TaSiN), tungsten nitride (WN) or a combination thereof. The conductive material for the upper electrode 20 may be deposited using physical vapor deposition (PVD), such as plating or sputtering, or may be deposited using chemical vapor deposition (CVD). In some embodiments, the upper electrode 20 fills the entirety of the trench 13, or the deposited material layer that provides the upper electrode 20 pinches the opening of the trench 13 closed forming a void 21 in a lower portion of the trench 13. Following the formation of the upper electrode 20, the pad stack 6 may be removed using a planarization process, such as chemical mechanical planarization (CMP), stopping on the upper surface of the SOI layer 4, as depicted in FIG. 8. The upper electrode 20, node dielectric layer 19 and the metal semiconductor alloy lower electrode 18 provide a trench capacitor 30.

Figure 9:
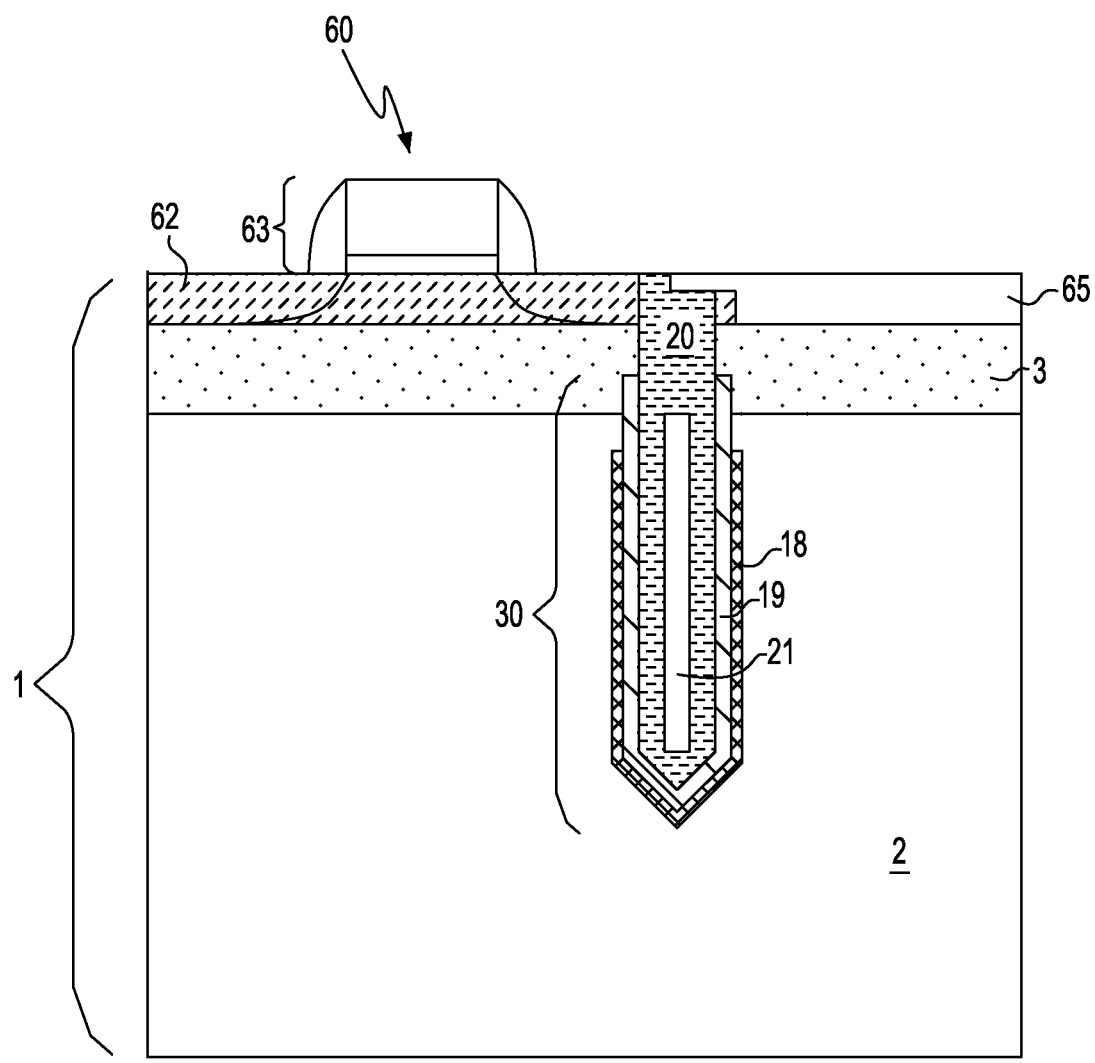
FIG. 9 is a side cross-sectional view of an embedded dynamic random access memory device, in accordance with one embodiment of the present disclosure.

Referring to FIG. 9, the trench capacitor 30 may be employed in a memory device, such as an embedded dynamic random access memory (eDRAM) device. As used herein, the term "memory device" means a structure in which the electrical state thereof can be altered and then retained in the altered state, in this way a bit of information can be stored. In one embodiment, the memory device includes a trench present in an SOI substrate 1, and a capacitor present in the trench, i.e. trench capacitor 30. The trench capacitor 30 includes a lower electrode comprised of a metal semiconductor alloy, i.e., metal semiconductor alloy lower electrode 18, a high-k dielectric node layer 19, and an upper electrode 20 comprised of a metal. The memory device may also include a pass transistor 60 in electrical communication with the trench capacitor 30. In one embodiment, an isolation region 65, such as a trench top oxide (TTO), is formed overlying the trench capacitor 30. In one embodiment, at least one pass transistor 60 is formed on the SOI layer 4 in electrical communication with the trench capacitor 30. In one embodiment, each of the pass transistors 60 is a field effect transistors (FETs), such as n-type and/or p-type FETs. Each field effect transistor (FET) may include source and drain regions 62 and a gate structure 63. Typically, at least one of the source region and drain regions 62 of the pass transistor 60 is in electrical communication with the upper electrode 20 of the trench capacitor 30.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a trench structure comprising:
   providing a semiconductor substrate including a semiconductor on insulating (SOI) layer on top of a buried dielectric layer, wherein the buried dielectric layer is on top of a base semiconductor layer;
   forming a trench to a first depth in the semiconductor substrate, wherein the first depth of the trench extends through the SOI layer and the buried dielectric layer terminating on the base semiconductor layer;
   forming a dielectric spacer on sidewalls of the trench, wherein the dielectric spacer extends to an upper surface of the base semiconductor layer;
   extending the trench to a second depth into the base semiconductor layer of the semiconductor substrate;
   forming a metal-containing layer comprising a metal nitride on the sidewalls of the trench and a base of the trench, wherein the metal-containing layer is in direct contact with the base semiconductor layer of the semiconductor substrate;
   converting the metal-containing layer that is in direct contact with the base semiconductor layer into a metal semiconductor alloy lower electrode, wherein an upper edge of the metal semiconductor alloy lower electrode is aligned to the upper surface of the base semiconductor layer, wherein the converting of the metal-containing layer into the metal semiconductor alloy lower electrode comprises a two stage annealing process, wherein a first stage of the two stage annealing process converts the metal nitride to element metal, and a second stage of the two stage annealing process converts the element metal to a metal silicide where the metal silicide is in direct contact with the sidewalls and base of the trench in the base semiconductor layer;
   forming a dielectric layer at least on the metal semiconductor alloy lower electrode; and
   forming an upper electrode on the dielectric layer.

2. The method of claim 1, wherein the forming of the dielectric spacer on the sidewalls of the trench comprises a conformal deposition of a dielectric material layer on the sidewalls of the trench and a base of the trench at the first depth; and removing the dielectric material layer from the base of the trench at the first depth, wherein a remaining portion of the dielectric material layer provides the dielectric spacer on the sidewalls of the trench at the first depth.

3. The method of claim 1, wherein the extending of the trench into the semiconductor substrate comprises an anisotropic etch to the second depth into the base semiconductor layer.

4. The method of claim 1, wherein the base semiconductor layer has a maximum concentration of n-type, p-type or a combination of n-type and p-type dopant in the sidewalls of the trench at the second depth that is no greater than $1\times10^{15}$ atoms/cm$^3$.

5. The method of claim 1, further comprising ion implanting the sidewalls of the trench at the second depth in the base semiconductor layer with an n-type or p-type dopant to a concentration ranging from $1\times10^{14}$ atoms/cm$^3$ to $1\times10^{19}$ atoms/cm$^3$.

6. The method of claim 1, wherein the forming of the metal-containing layer into direct contact with the base semiconductor layer of the semiconductor substrate comprises a conformal deposition method.

7. The method of claim 6, wherein the conformal deposition method comprises atomic layer deposition (ALD).

8. The method of claim 7, wherein the atomic layer deposition (ALD) comprises depositing tungsten nitride (WN).

9. The method of claim 1, wherein the first stage of the two stage annealing process includes a first temperature ranging from 750° C. or greater to less than 1000° C., and wherein the second stage of the two stage annealing process includes a second temperature of greater than 900° C.

10. The method of claim 1, wherein following the converting of the metal-containing layer that is in direct contact with the base semiconductor layer into the metal semiconductor alloy lower electrode, a remaining portion of the metal-containing layer that is in direct contact with the buried dielectric layer and the dielectric spacer and is not converted to the metal semiconductor alloy lower electrode is removed with an etch that is selective to the metal semiconductor alloy lower electrode.

11. The method of claim 1, wherein the forming of the dielectric layer at least on the metal semiconductor alloy lower electrode comprises depositing a high-k dielectric material on at least the metal semiconductor alloy lower electrode that is present on the base and the sidewalls of the trench in the base semiconductor layer.

12. The method of claim 11, wherein the high-k dielectric material is comprised of a hafnium containing material.

13. The method of claim 12, wherein the high-k dielectric material is deposited by atomic layer deposition (ALD) or chemical vapor deposition (CVD).

14. The method of claim 13, wherein the forming of the upper electrode on the dielectric layer comprises depositing a metal or a mixture of different metals on the dielectric layer.

15. The method of claim 14, wherein the metal is deposited using atomic layer deposition (ALD) or chemical vapor deposition (CVD).

16. The method of claim 1, wherein the trench structure is an embedded dynamic random access (eDRAM) memory device comprising a pass transistor in electrical communication with a capacitor provided by the metal semiconductor alloy lower electrode, the dielectric layer, and the upper electrode.

17. The method of claim 1, wherein the metal nitride comprises tungsten nitride (WN), titanium nitride (TiN), tantalum nitride (TaN) or tantalum silicon nitride (TaSiN).

* * * * *